United States Patent
Chen et al.

(10) Patent No.: US 9,858,989 B1
(45) Date of Patent: Jan. 2, 2018

(54) SERIALIZED SRAM ACCESS TO REDUCE CONGESTION

(71) Applicant: Taiwan Semiconductor Manufacturing Co., Ltd., Hsin-Chu (TW)

(72) Inventors: Hsin-Cheng Chen, Hsinchu County (TW); Jack Liu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/364,082

(22) Filed: Nov. 29, 2016

(51) Int. Cl.
*G11C 11/419* (2006.01)
*G11C 11/418* (2006.01)
*G11C 13/04* (2006.01)

(52) U.S. Cl.
CPC .......... *G11C 11/419* (2013.01); *G11C 11/418* (2013.01); *G11C 13/048* (2013.01)

(58) Field of Classification Search
CPC .......... G11C 13/048; B82Y 10/00; G02F 2/02
USPC ........................................................ 365/120
See application file for complete search history.

(56) References Cited

U.S. PATENT DOCUMENTS

| | | | |
|---|---|---|---|
| 7,171,528 B2 * | 1/2007 | Evans | G11C 7/1009 365/120 |
| 8,605,523 B2 | 12/2013 | Tao et al. | |
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2014/0153345 A1 | 6/2014 | Kim et al. | |
| 2014/0233330 A1 | 8/2014 | Ko et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

*Primary Examiner* — Jason Lappas
(74) *Attorney, Agent, or Firm* — Duane Morris LLP

(57) ABSTRACT

A circuit includes a serializer configured to receive a non-serialized input signal having a first bit-width and generate a plurality of serialized input signals each having a second bit-width. A static random access memory (SRAM) array is configured to receive each of the plurality of serialized input signals. The SRAM array is further configured to generate a plurality of serialized output signals. A de-serializer is configured to receive the plurality of serialized output signals and generate a non-serialized output signal. The plurality of serialized output signals each have a bit-width equal to second bit-width and the non-serialized output signal has a bit-width equal to the first bit-width.

11 Claims, 14 Drawing Sheets

SERIALIZED SRAM ACCESS TO REDUCE CONGESTION

FIELD

This disclosure relates to static random access memory (SRAM), and more specifically, to limiting congestion during SRAM read/write operations.

BACKGROUND

Traditional system-on-chip (SoC) systems utilize large SRAM bulks. The SRAM bulks are used for data buffering, for example, in multiple carrier communication or in data centers. When multiple SRAM bulks are integrated on an SoC, congestion occurs due to a limited number of data-in (DI) and data-out (DO) buses. If the congestion problem cannot be reduced through chip routing/redesign, the area of the SoC must be expanded (to accommodate additional DI/DO buses) and/or the clock frequency lowered, leading to performance degradation and cost increases.

Current SoC systems use distributed SRAM or ring architecture to attempt to address congestion issues. Distributed SRAM makes sharing of SRAM bulks difficult, for example, among each port in a data center. Ring architecture introduces latency increases in the SoC. Both current solutions lead to additional performance degradations in the SoC.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

This description of the exemplary embodiments is intended to be read in connection with the accompanying drawings, which are to be considered part of the entire written description. Terms concerning attachments, coupling and the like, such as "connected," "interconnected," "electrically connected," and "electrically coupled" refer to a relationship wherein structures are electrically attached or coupled to one another, either directly or indirectly through intervening circuit elements, as well as both wired or wireless attachments or relationships, unless expressly described otherwise.

In various embodiments, a serialized/de-serialized SRAM device is disclosed. The serialized/de-serialized SRAM device includes an SRAM array having a predetermined number of addressable bit-cells arranged in a plurality of columns. During a write operation, a serializer is configured to receive a non-serialized input signal having first bit-width (e.g., a first predetermined number of bits) and generate a plurality of serialized input signals. Each of the serialized input signals are provided to the SRAM array over a plurality of sequential clock cycles and are written to respective bit-cells in each of the columns. During a read operation, a de-serializer is configured to receive a plurality of serialized output signals from the SRAM array over a plurality of sequential clock cycles. The plurality of serialized output signals are generated by a plurality of sequential reads from each of the columns in the SRAM array. The de-serializer combines the serialized output signals to generate a non-serialized output signal having a bit-width equal to the non-serialized input signal.

Figure 1:
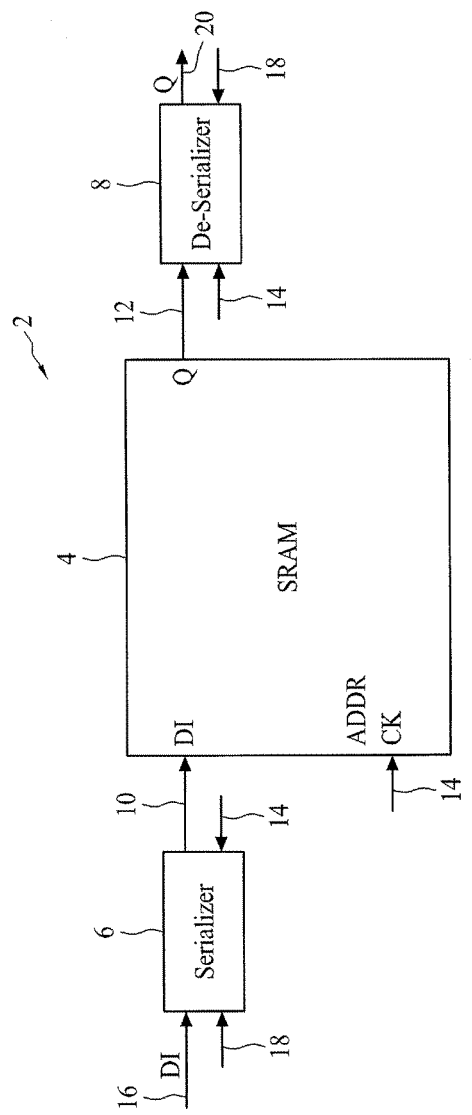
FIG. 1 illustrates a serialized/de-serialized SRAM circuit, in accordance with some embodiments.

FIG. 1 illustrates a serialized/de-serialized SRAM device 2, in accordance with some embodiments. The serialized/de-serialized SRAM device 2 includes an SRAM array 4 having a plurality of bit cells arranged in a plurality of columns. For example, in some embodiments, the SRAM array includes 512 bit cells arranged in 64 columns and 8 rows, although it will be appreciated that the SRAM array 4 can include any suitable number of bit cells, such as 64, 128, 256, 1024, 2048, 4096, 8192, 16,384 and/or any other suitable number of bit cells arranged in any number of rows and/or columns. An example embodiment of an SRAM array 4 is discussed in more detail below with respect to FIGS. 3A and 6A.

The SRAM array 4 is configured to receive an input signal 10. The input signal 10 has a first bit-width (e.g., the number of bits in the signal) equal to the number of columns in the SRAM array 4. For example, in some embodiments, the SRAM array 4 includes 64 columns and the input signal 10 has a 64-bit width, although it will be appreciated that the SRAM array 4 and the first bit-width can be any other suitable size. The SRAM array 4 is configured to simultaneously write each bit of the input signal 10 to a respective column of the SRAM array 4. For example, in some embodiments, the SRAM array 4 includes 64 columns and receives a 64-bit input signal 10. The SRAM array 4 writes each of the 64-bits in the 64-bit input signal 10 to a bit-cell in a respective one of the 64 columns. In some embodiments, the SRAM array 4 receives a first clock signal 14 configured to control read and/or write operations of the SRAM array 4.

The input signal 10 is a one of a plurality of serialized input signals. In some embodiments, a first circuit (or serializer) 6 is configured to receive a non-serialized input signal 16. The non-serialized input signal 16 has a second bit-width equal to a positive integer multiple of the first bit-width of the serialized input signal 10. For example, in some embodiments, the serialized input signal 10 has a 64-bit width and the non-serialized input signal 16 has a 512-bit width (e.g., 64*8). Although specific embodiments are discussed herein having an 8× multiple, it will be appreciated that the second bit-width can be equal to any integer multiple of the first bit-width. For example, in embodiments including a first bit-width X, the non-serialized input signal 16 can have a bit-width equal to 2×, 4×, 6×, 8×, 16×, 32×, etc. and is within the scope of this disclosure. In some embodiments, the second bit-width is a non-integer multiple of the first bit-width and the serializer 6 is configured to add one or more padding bits to each of the plurality of serialized input signals 10. As used herein, the term "serializer" refers to any circuit configured to receive a non-serialized input signal and generate a plurality serialized (e.g., sequential) signals each including a portion of the non-serialized input signal.

In some embodiments, the serializer 6 receives the first clock signal 14 and a second clock signal 18. In some embodiments, the first clock signal 14 is X-times faster than the second clock signal 18, where X is a positive integer equal to the bit-width of the non-serialized input signal 16 divided by the bit-width of the input signal 10. For example, in some embodiments, the non-serialized input signal 16 can have a bit-width of 512 bits, the input signal 10 can have a bit-width of 64 bits, and the first clock signal 14 is 8-times faster (512/64) than the clock cycle of the second clock signal 18. In some embodiments, the serializer 6 is configured to receive a non-serialized input signal 16 on the second clock signal and generate one of the plurality of serialized input signals 10 on the second clock signal 18.

In some embodiments, the serializer 6 provides a plurality of serialized input signals 10 to the SRAM array 4. Each signal in the plurality of serialized'input signals 10 includes a sub-set of the bits in the non-serialized input signal 16. For example, in some embodiments, the serializer 6 divides a 512 bit non-serialized input signal 16 into a plurality of 64-bit serialized input signals 10, although it will be appreciated that the non-serialized input signal 16 and the plurality of serialized input signals 10 can have any suitable bit-widths. The plurality of serialized input signals 10 are provided to the SRAM array 4 and each bit is stored in one of the columns of the SRAM array 4 during a plurality of serialized write operations. One embodiment of a serialized write operation is discussed in more detail with respect to FIG. 6A below.

In some embodiments, the SRAM array 4 is configured to generate an output signal 12. The output signal 12 has a bit-width equal to the first bit-width of the input signal 10. The SRAM array 4 includes a plurality column outputs each configured to generate a bit of the output signal 12. For example, in embodiments having an SRAM array 4 including 64 columns, the SRAM array 4 generates a 64-bit output signal 12.

The output signal 12 is one of a plurality of serialized output signals. In some embodiments, the serialized output signals 12 are provided to a second circuit (or de-serializer) 8 configured to de-serialize two or more of the plurality of serialized output signals 12 to generate a non-serialized output signal 20. In some embodiments, the non-serialized output signal 20 includes a bit-width equal a positive integer multiple of the bit-width of each of the plurality of output signals 12 (e.g., the first bit-width). In some embodiments, the bit-width of the non-serialized output signal is equal to the bit-width of the non-serialized input signal (e.g., the second bit-width), although it will be appreciated that the non-serialized input signal 16 and the non-serialized output signal 20 can have different bit-widths. Although specific embodiments are discussed herein, it will be appreciated that the non-serialized output signal 20 can have a bit-width equal to any positive integer multiple of the plurality of serialized output signals 12. For example, in embodiments including an output signal 12 having a bit-width of X, the non-serialized output signal 20 can have a bit-width equal to 2×, 4×, 8×, 16×, 32×, etc. and is within the scope of this disclosure. As used herein, the term "de-serializer" refers to any circuit configured to receive a plurality of serialized signals and generate a non-serialized output signal including data from each of the plurality of serialized signals.

In some embodiments, the de-serializer 8 receives the plurality of serialized output signals 12 from the SRAM array 4 on the first clock signal 14 and generates a non-serialized output signal 20 on the second clock signal 18. The de-serializer 8 receives a plurality of serialized output signals 12 from the SRAM array 4 over a predetermined number of first clock signal 14 cycles. Each output signal 12 in the plurality of serialized output signals 12 is combined (e.g., concatenated) to generate the non-serialized output signal 20. For example, in some embodiments, the de-serializer 8 combines a plurality of serialized output signals 12 including 8 64-bit serialized output signals 12 into a 512 bit non-serialized output signal 20, although it will be appreciated that any number of serialized output signals 12 having any number of bits can be combined to form the non-serialized output signal 20. The plurality of serialized output signals 12 are provided by a plurality of serialized read operations performed by the SRAM array 4. One embodiment of a serialized read operation is discussed in more detail with respect to FIG. 3A below.

Figure 2A:
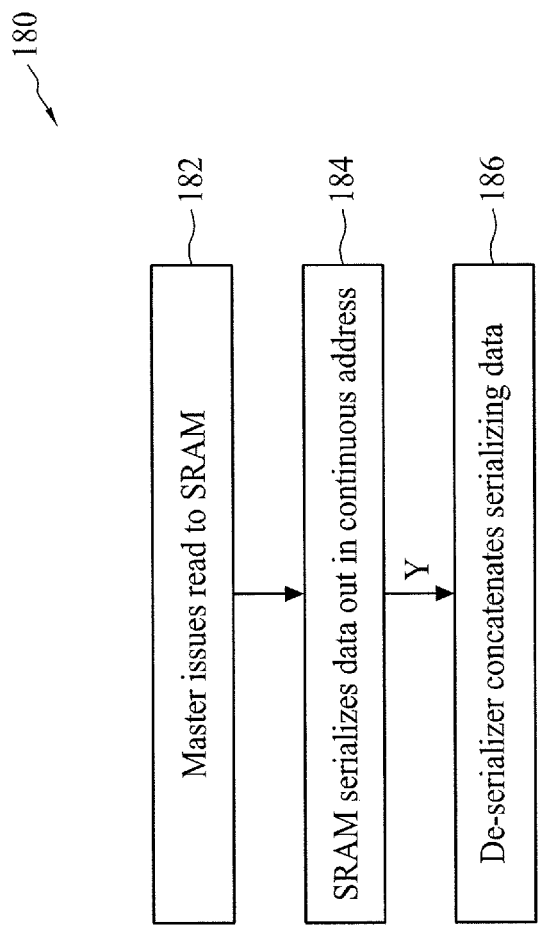
FIG. 2A illustrates a read method of the serialized/de-serialized SRAM circuit of FIG. 1, in accordance with some embodiments.

FIG. 2A illustrates a read method 180 of the SRAM device 2 of FIG. 1, in accordance with some embodiments. In a first operation 182, a read signal is provided to the SRAM array 4a. At operation 184, the SRAM array 4a generates a plurality of serialized output signals 12. The plurality of serialized output signals 12 have continuous addressing between each of the serialized output signals 12. The continuous address corresponds to addresses in the non-serialized output signal 20. The de-serializer 8 receives each of the plurality of serialized output signals 12 over an equal plurality of first clock signal 14 cycles. At operation 186, the de-serializer 8 combines (e.g., concatenates) the plurality of serialized output signals 12 to generate the non-serialized output signal 20. In some embodiments, the de-serializer 8 is configured to combine each of the serialized output signals 12 in a continuous address corresponding to the addressing of each of the plurality of serialized output signals 12.

Figure 2B:
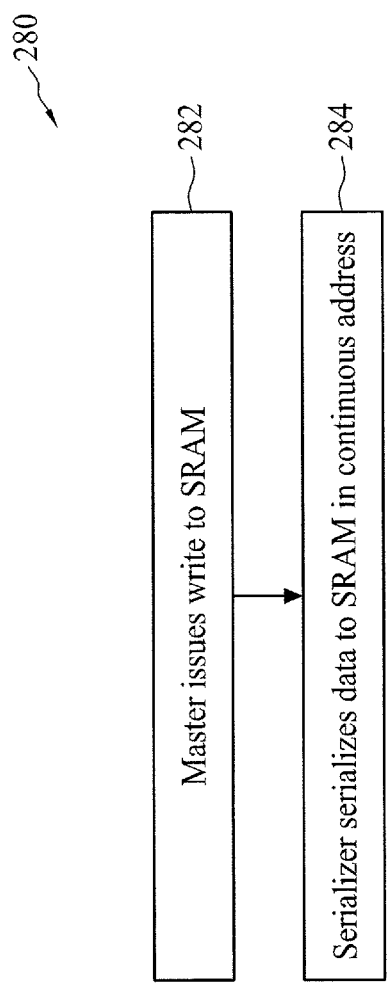
FIG. 2B illustrates a write method of serialized/de-serialized SRAM circuit of FIG. 1, in accordance with some embodiments.

FIG. 2B illustrates a write method 280 of the SRAM device 2 of FIG. 1, in accordance with some embodiments. At operation 282, a write signal is provided to the SRAM array 4a, for example, from an SRAM master. At operation 284, a serializer 6 generates a plurality of serialized input signals 10 from a non-serialized input signal 16. each of the plurality of serialized input signals 10 are provided to the SRAM array 4 with continuous addressing for storage in an associated bit-cell in the SRAM array 4. In some embodiments, the SRAM array 4 stores each of the plurality of serialized input signals 10 over an equal plurality of first clock signal 14 cycles.

Figure 3A:
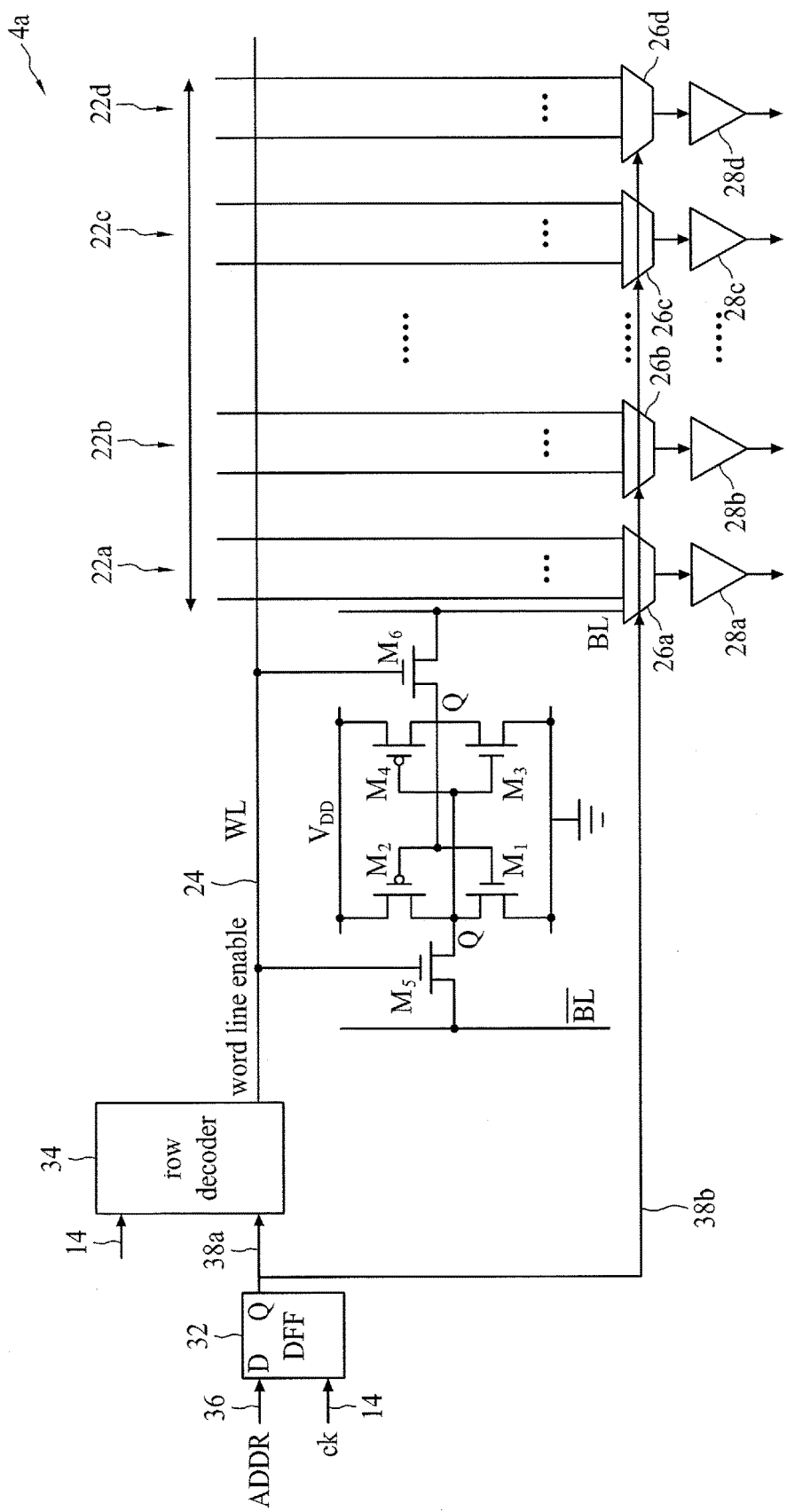
FIG. 3A illustrates a serialized/de-serialized SRAM array configured for a serialized read operation, in accordance with some embodiments.

FIG. 3A illustrates an SRAM array 4a configured for a serialized read operation, in accordance with some embodiments. The SRAM array 4a is similar to the SRAM array 4 discussed above and similar description is not repeated herein. The SRAM array 4a includes a plurality of columns 22a-22d (collectively "the columns 22"). Each of the columns 22 includes a plurality of rows including one or more bit-cells, such as, for example, eight rows of bit-cells, although it will be appreciated that each of the columns 22 can include any suitable number of rows. At least one word-line 24 is coupled to each of the plurality of columns 22. In some embodiments, each column 22 includes a plurality of bit-lines each coupled to at least one of the bit-cells in the respective columns 22.

In some embodiments, each of the columns 22 includes a multiplexer 26a-26d (collectively "the column multiplexers 26") coupled to a sensing amplifier 28a-28d (collectively "the sensing amplifiers 28") for generating a bit output signal 30a-30d (collectively "the bit output signals 30"). Each of the bit output signals 30 comprises one bit of a serialized output signal 12. For example, in some embodiments, the SRAM array 4a includes 64 columns in the plurality of columns 22. During a read operation, each of the columns outputs a single bit output signal 30 which is combined to into a 64-bit wide output signal 12.

In some embodiments, the SRAM array 4a includes one or more addressing elements, such as a d-type flip flop 32 and/or a row decoder 34. Each of the d-type flip flops 32 receive the first clock signal 14. The d-type flip flop 32 receives an address signal 36. The address signal 36 identifies the bits in each of the columns 22 that are to be read during one of a plurality of serialized read operations. In some embodiments, a first sub-set 38a of the address signal 36 is provided to each of the plurality of columns 22 to address a specific bit-cell within the column 22. A second sub-set 38b of the address signal 36 is provided to each of the column multiplexers 26 to select a bit-line in each of the columns 22 for output during one of the plurality of serialized read operations.

Figure 3B:
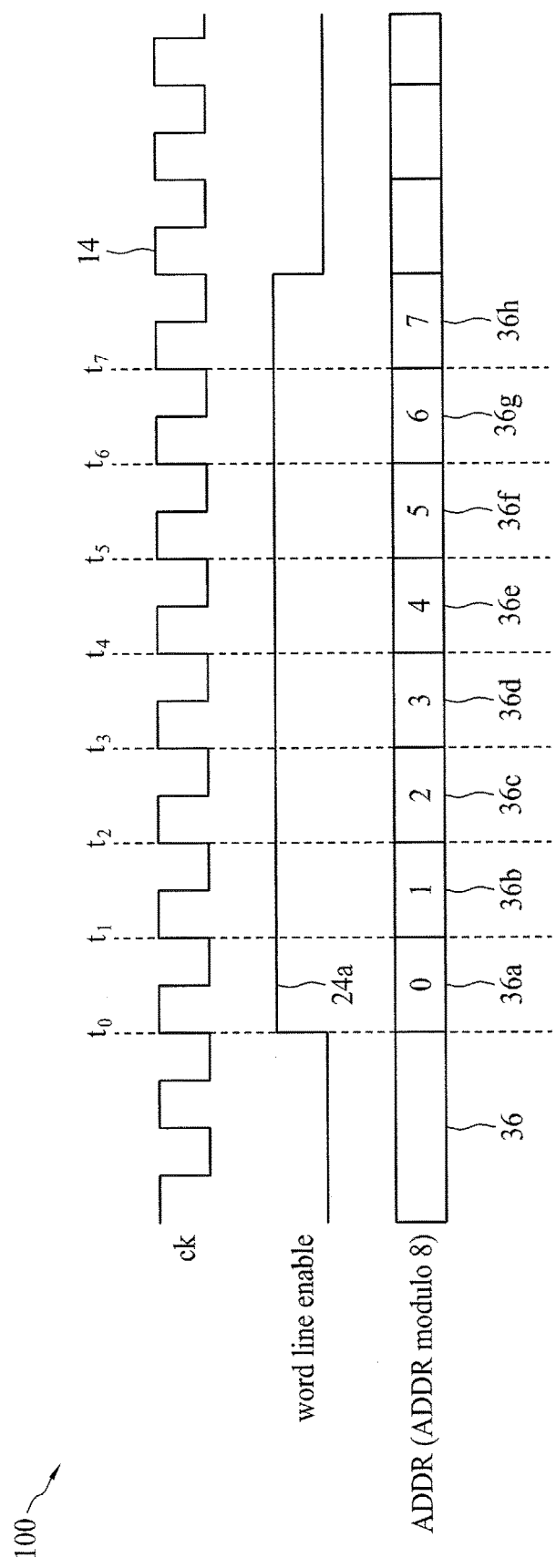
FIG. 3B illustrates a timing diagram of the serialized/de-serialized SRAM array of FIG. 3A, in accordance with some embodiments.

FIG. 3B illustrates a timing diagram 100 of the SRAM array 4a. At time t0, an address signal 36 is received at one or more circuit elements, such as the d-type flip flop 32. In some embodiments, a read-enable signal (not shown) is also received at the SRAM array 4a. The address signal 36 causes the row decoder 34 to set the word line enable signal 24a high, indicating a read operation. The first three bits of the address signal 36, e.g., the second sub-set 38b of the address signal 36, are provided to the column multiplexer 26 in each of the columns 22. The remaining bits of the address signal 36, e.g., the first sub-set 38a of the address signal 36, are provided to each of the columns 22 to select one of the plurality of bit-lines in each of the columns 22. Each column 22 sequentially outputs one bit per clock cycle of the first clock signal 14. For example, in the illustrated embodiment, the address signal is divided into 8 address blocks 36a-36h (e.g., the address signal is divided by a modulo 8 operation). Each of the address blocks 36a-36h corresponds one of eight bit-lines in each of the columns 22 of the SRAM array 4a.

At time t0, the first address block 36a selects a first set of bit-lines to generate a first serialized output signal 12. At $t_1$, the second address block 36b selects a second set of bit-lines to generate a second serialized signal 12. At each subsequent first clock signal 14 cycle (e.g., times $t_2$-$t_7$) an address block 36c-36h selects a subsequent one of the bit-lines in each of the columns 22 to generate each of the plurality of serialized output signals 12. Each column 22 sequentially outputs a number of bits equal to the number of bit-lines in the column 22. The plurality of serialized output signals 12 generated by the sequential read operations are provided to a de-serializer 8 (as shown in FIG. 1) and combined into a non-serialized output signal 20. In some embodiments, the SRAM array 4a generates a number of serialized output signals equal to the number of bit-lines in each of the columns 22.

Figure 4:
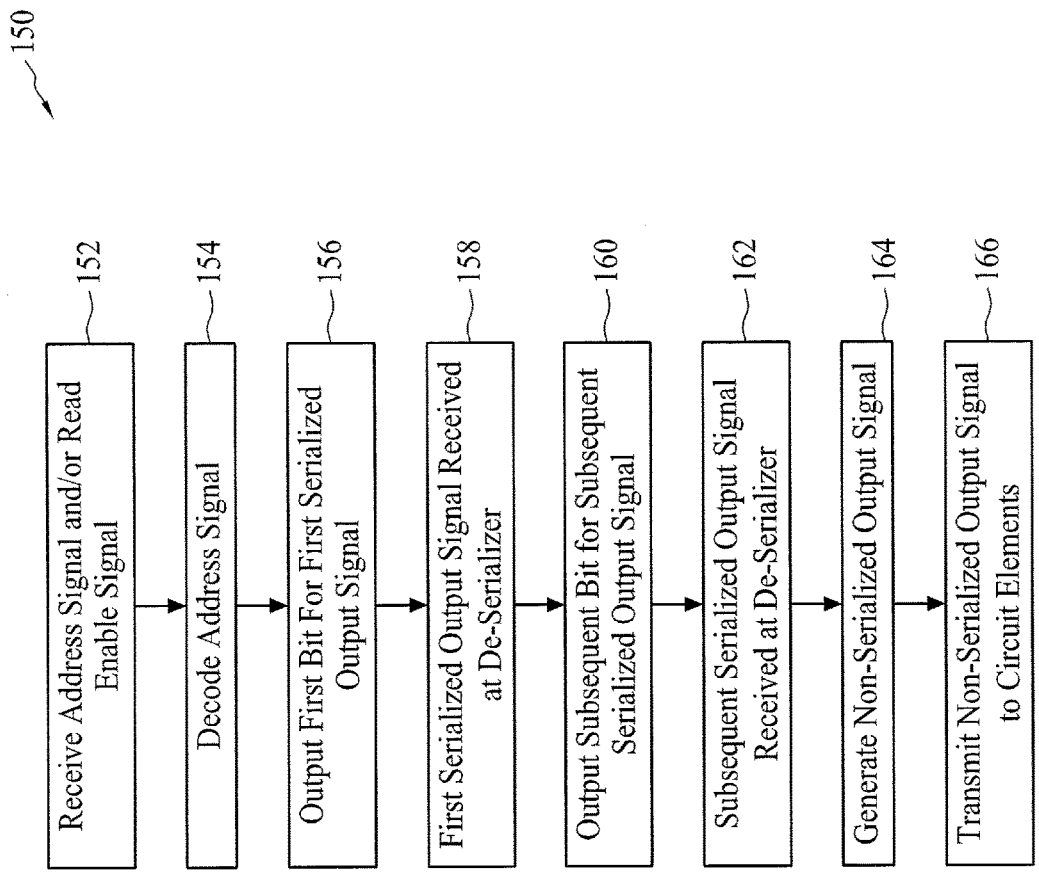
FIG. 4 illustrates a read operation method of the serialized/de-serialized SRAM array of FIG. 3A, in accordance with some embodiments

FIG. 4 illustrates a read operation method 150 of the SRAM array 4a, in accordance with some embodiments. At operation 152, the SRAM array 4a receives an address signal 36 and a read-enable signal. The address signal 36 and/or the read enable signal from any suitable circuit element, such as an SRAM master. At operation 154, the SRAM array 4a generates one or more word line enable signals and one or more bit-line select signals. For example, in some embodiments, the SRAM array 4a generates one or more signals to configure a column multiplexer in each column 22 to select a bit-line. At operation 156, the SRAM array 4a outputs a first bit from each of the columns 22 to generate a first serialized output signal 12. At operation 158, the first serialized output signal 12 is provided to and latched by a de-serializer 8. At operation 160, the SRAM array 4a outputs a second bit from each of the columns 22 to generate a subsequent serialized output signal 12 and provides the subsequent serialized output signal 12 to the de-serializer 8 at operation 162. The SRAM array 4a repeats operations 160-162 until a predetermined number of serialized output signals 12 (X) have been generated. At operation 164, the de-serializer 8 generates a non-serialized output signal 20 having a bit-width equal to the bit-width of each of the serialized output signals times X. At operation 166, the non-serialized output signal 20 is provided to one or more additional circuit elements.

Figure 5:
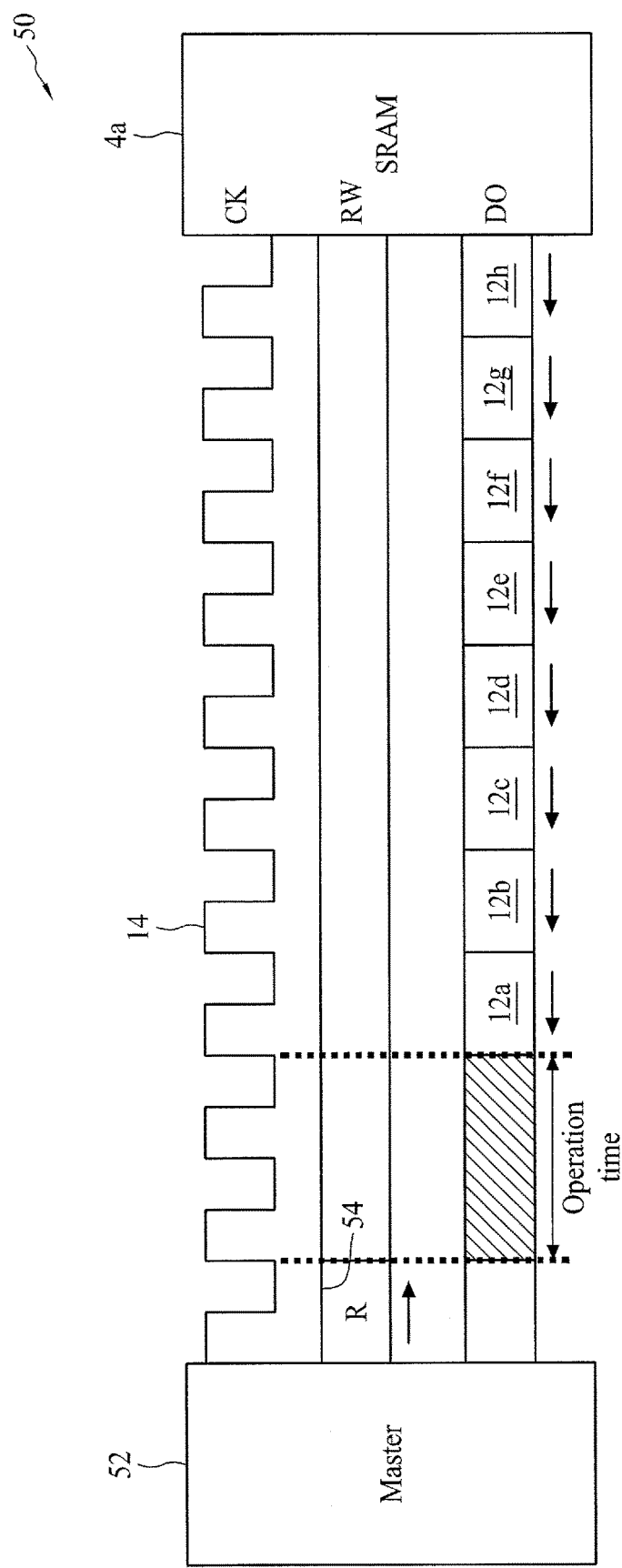
FIG. 5 illustrates an SRAM system having an SRAM master and one or more serialized/de-serialized SRAM arrays configured for a read operation, in accordance with some embodiments.

FIG. 5 illustrates an SRAM system 50 having an SRAM master 52 and one or more SRAM arrays 4a configured for a read operation, in accordance with some embodiments. The SRAM master 52 is configured to receive a serialized input signal 10 from the SRAM array 4a. The SRAM master 52 generates a read signal 54 that is provided to the SRAM array 4a. The read signal 54 includes a read-enable signal and/or an address signal indicating a read operation. The SRAM array 4a receives the read signal 54 and generates a plurality of serialized output signals 12a-12h. Each of the plurality of serialized output signals 12a-12h include a bit-width equal to the number of columns in the SRAM array 4a. The SRAM master 52 combines a predetermined number of serialized output signals 10a-10h to generate a non-serialized output signal 20. In other embodiments, the SRAM mater 52 passes the serialized output signals 12a-12h to one or more additional circuit elements (not shown).

Figure 6A:
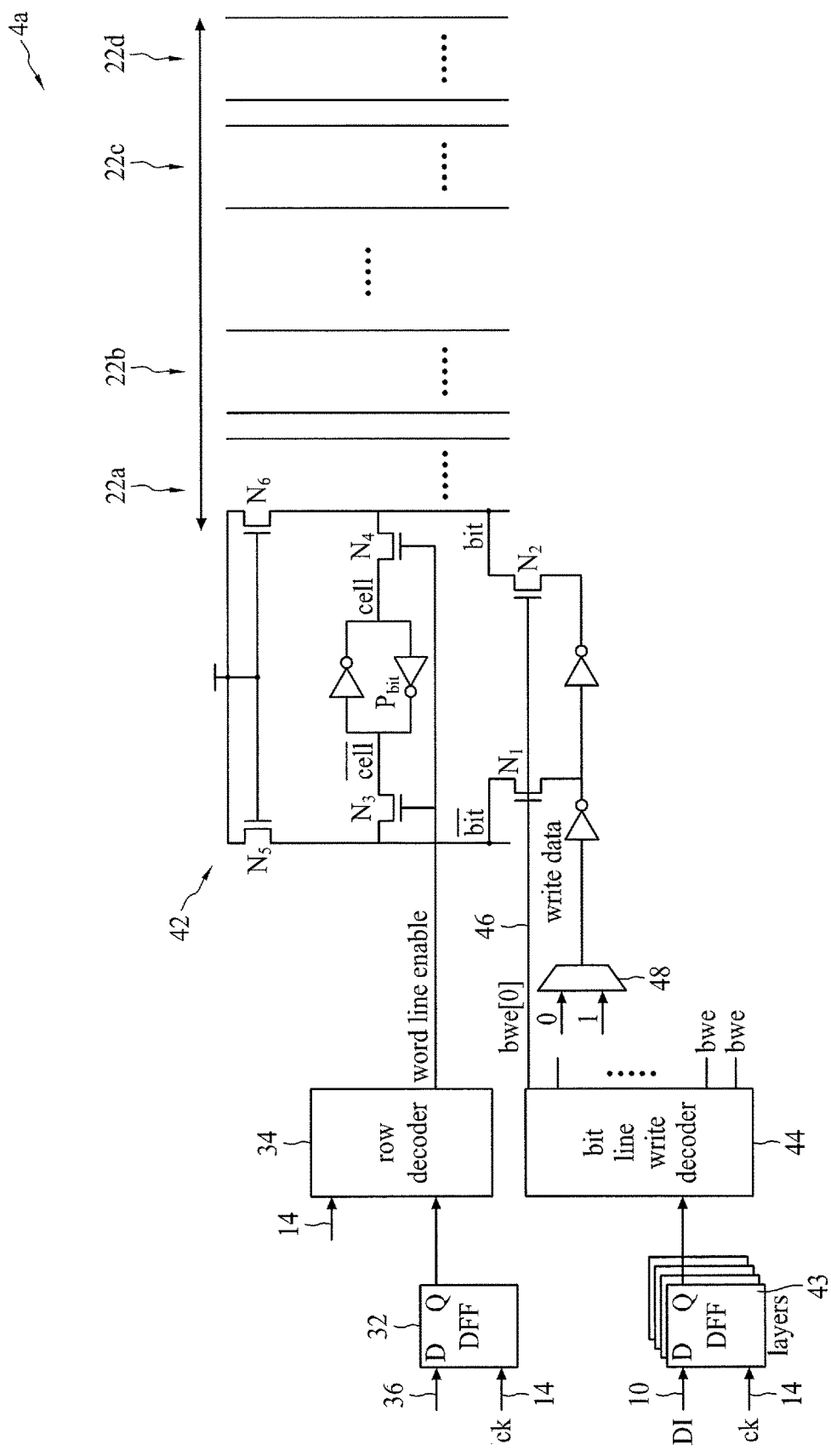
FIG. 6A illustrates a serialized/de-serialized SRAM array configured for a serialized write operation, in accordance with some embodiments.

FIG. 6A illustrates an SRAM array 4a configured for a serialized write operation, in accordance with some embodiments. As discussed above, the SRAM array 4a includes a plurality of columns 22. Each of the plurality of columns 22 includes a plurality of bit-cells 42 configured to store a bit. An input signal 10 (such as one of a plurality of serialized input signals) is received at a plurality of d-type flip-flops 43. In some embodiments, each of the bits in the serialized input signal 10 are provided to a corresponding d-type flip-flop 43. The d-type flip-flops 43 latch the serialized input signal 10 and provide the bit-values to one or more additional circuit elements during a write operation.

In some embodiments, the SRAM array 4a includes a bit line write decoder 44 configured to latch each of the bit-signals received from the d-type flip-flops 43 during one of a plurality of serialized write operations. The bit-line write decoder 44 is configured to receive one of the plurality of serialized input signals 10 and generate a write signal 46 for each of the respective bit-cells 42 to be written during the current one of the plurality of serialized write operations.

In some embodiments, the bit-line write decoder 44 is configured to latch bits from two or more of the plurality of serialized input signals 10 and generate one or more simultaneous write operations to write all latched bits. For example, in some embodiments, each of the write signals 46 is provided to a corresponding bit-multiplexer 48. Each of the bit-multiplexers 48 receive one or more control signals (not shown). The bit-multiplexers 48 are configured to pass a first set of write signals 46 having a first value during a first write period and a second set of write signals 46 having a second value during a second write period. For example, in some embodiments, during a first write period, the bit-multiplexers 48 are configured to pass a first set of write signals 46 having a logic high (or logic 1) value and during a second write period, the bit multiplexers 48 are configured to pass a second set of write signals 46 having a logic low (or logic 0) value. In some embodiments, the bit-line write decoder 44 is configured to latch each of the plurality of serialized input signals 10 during an equal plurality of first clock signal 14 cycles, write a first set of bits during a second set of first clock signal 14 cycles, and write a second set of bits during a third set of first clock signal 14 cycles.

Figure 6B:
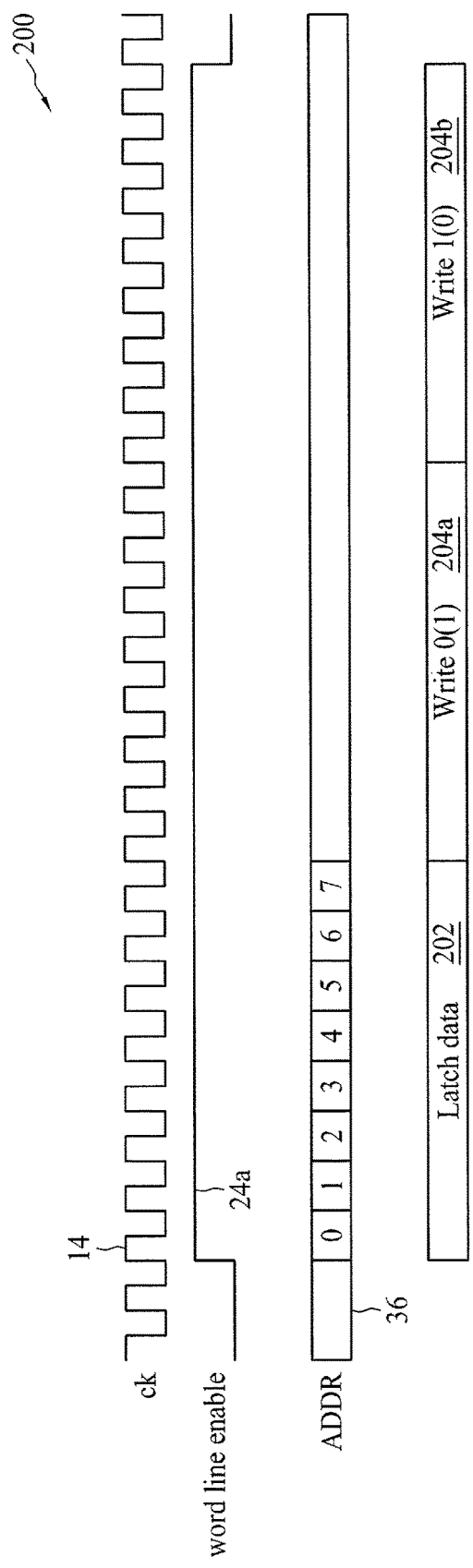
FIG. 6B illustrates a timing diagram of the serialized/de-serialized SRAM array of FIG. 6A, in accordance with some embodiments.

FIG. 6B illustrates a timing diagram 200 of a write operation of the SRAM array 4a, in accordance with some embodiments. At time t0, an address signal 36 is received at one or more address elements, such as the d-type flip-flop 32. In some embodiments, a write enable signal is received prior to and/or simultaneously with the address signal 36. The word-line enable signal 24a is set high, and the bit-line write decoder 44 latches each of the serialized input signals 10 over a predetermined latch period 202 (e.g., a predetermined number of cycles of the first clock signal 14 equal to the number of serialized input signals 10). After all of the data is latched, at time $t_1$, a first write operation is performed to write all of the logic high (or logic 1) bits to the respective bit-cells 42 during a first write period 204a. In some embodiments, the first write period 204a includes a predetermined number of cycles of the first clock signal 14 equal to the number of serialized input signals 10 received during the latch period 202. At time $t_2$, a second write operation is performed to write all of the logic low (or logic 0) bits to the respective bit-cells 42 during a second write period 204b. In some embodiments, the second write period 204b includes a predetermined number of cycles of the first clock signal 14 equal to the number of serialized input signals 10 received during the latch period 202.

Figure 7:
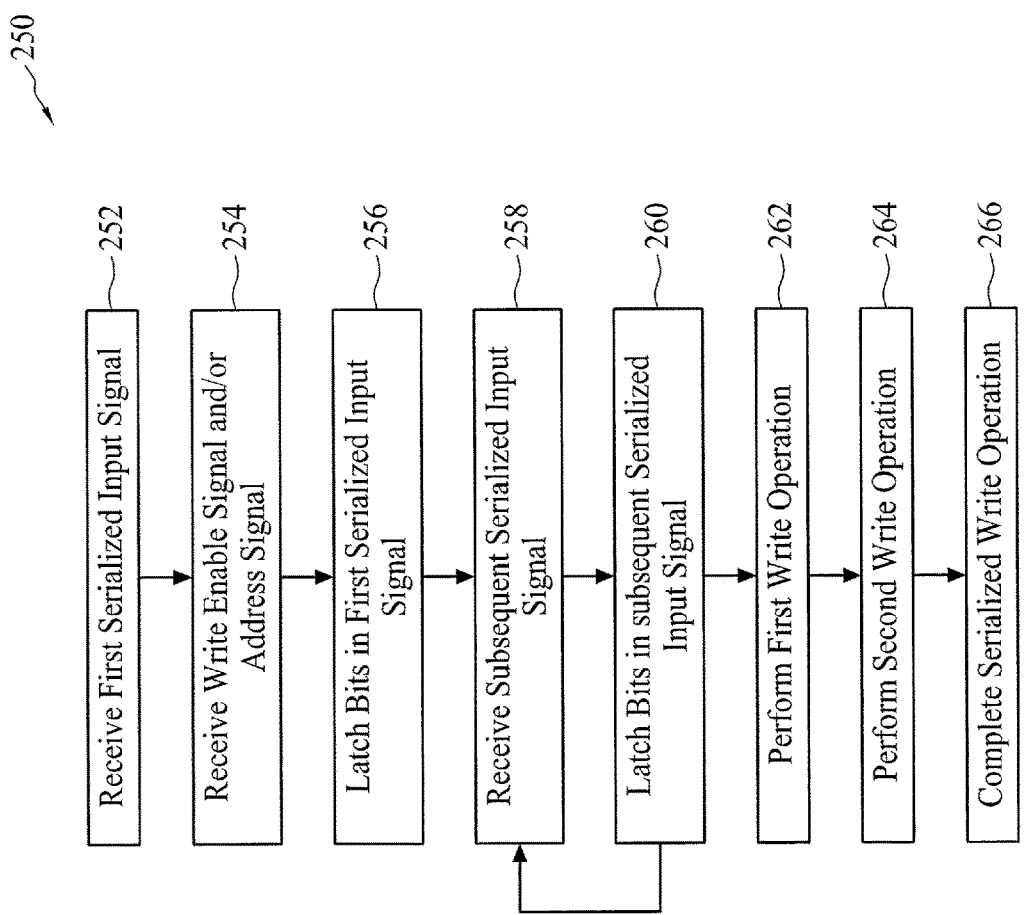
FIG. 7 illustrates a write operation method of the serialized/de-serialized SRAM array of FIG. 6A, in accordance with some embodiments.

FIG. 7 illustrates a write operation method 250 of the SRAM array 4a, in accordance with some embodiments. At operation 252, the SRAM array 4a receives a first serialized input signal, for example, from a serializer 6. At operation 254, the SRAM array 4a receives one or more control signals, such as a write-enable signal and/or an address signal 36. Although operations 252 and 254 are shown sequentially, it will be appreciated that these operations can occur simultaneously and/or in reverse order. At operation 256, a bit-line write decoder latches 44 each bit in the first serialized input signal. At operation 258, a subsequent serialized input signal is received at the SRAM array 4a. The subsequent serialized input signal includes a bit-width equal to the bit-width of the first serialized input signal. At operation 260, the bit-line write decoder 44 latches each bit in the subsequent serialized input signal. The SRAM array 4 repeats operations 258-260 for each subsequent serialized input signal received, for example, from a serializer 6.

After receiving a predetermined number of serialized input signals, the SRAM array 4a performs a first write operation at operation 262. The first write operation includes writing a first set of bits latched by the bit-line write decoder 44 having a first bit-value. In some embodiments, the first write operation includes a plurality of first clock cycles 14 equal to the number of bit-lines in each column 22 of the SRAM array 4a. At operation 264, the SRAM array 4a performs a second write operation. The second write operation includes writing a second set of bits latched by the bit-line write decoder 44 having a second bit-value, such as an opposite value of the first bit-value. In some embodiments, the second write operation includes a plurality of first clock cycles 14 equal to the number of bit-lines in each column 22 of the SRAM array 4a. At operation 266, the write operation completes and the SRAM array 4a enters a ready state for additional read/write operations.

Figure 8:
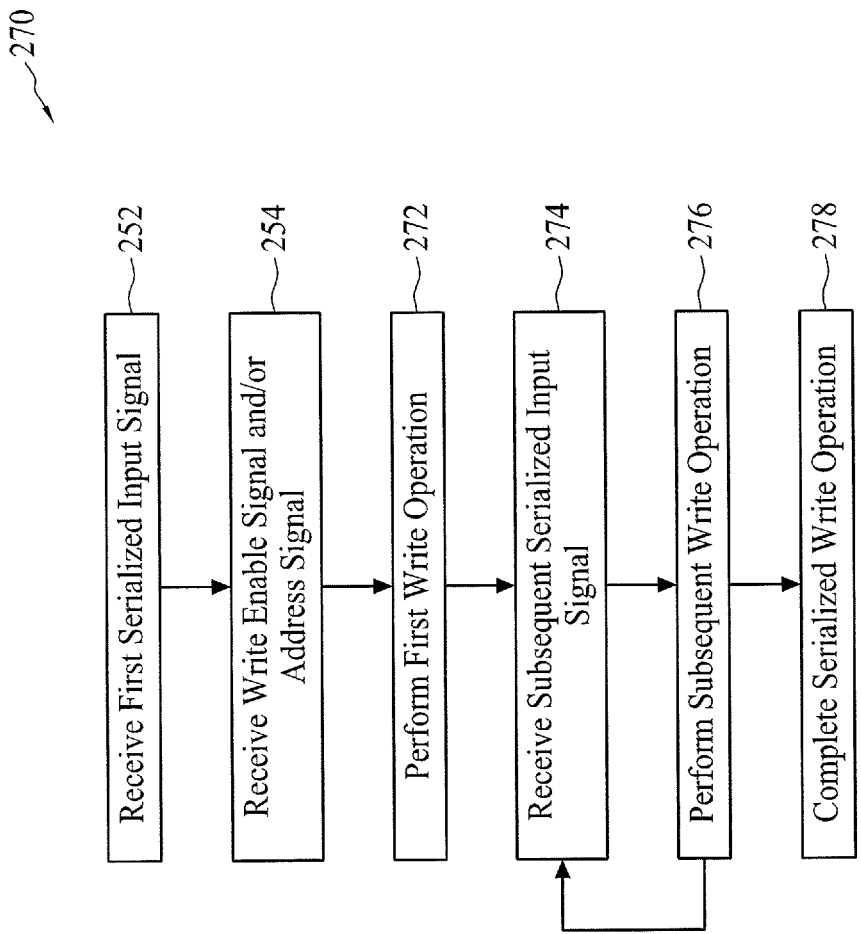
FIG. 8 illustrates a write operation method of the serialized/de-serialized SRAM array of FIG. 6A, in accordance with some embodiments.

FIG. 8 illustrates a write operation method 270 of the SRAM array 4a, in accordance with some embodiments. Operations 252-254 of the method 270 are identical to the operations 252-254 discussed above, and similar description is not repeated herein. At operation 272, the SRAM array 4a performs a first write operation. The first write operation writes each of the bits in the first serialized input signal to respective bit-lines in each of the columns 22 of the SRAM array 4a. For example, in some embodiments, each bit in the first serialized input signal corresponds to a first bit-line in each of the columns 22 in the SRAM array 4a. The first write operation can simultaneously write all of the bits in the first serialized input signal 10 and/or can be a two-step write operation in which a first set of bits with a first bit value is written during a first clock cycle and a second set of bits with a second bit value is written during a second clock cycle.

At operation 274, the SRAM array 4a receives a subsequent serialized input signal. The subsequent serialized input signal has a bit-width equal to the bit-width of the first serialized input signal 10. The subsequent serialized input signal can be received from, for example, a serializer 6. At operation 276, the SRAM array 4a performs a subsequent write operation. The subsequent write operation writes each of the bits in the subsequent serialized input signal to respective bit-lines in each of the columns 22 of the SRAM array 4a. The SRAM array 4a repeats operations 274-276 for each serialized input signal in the plurality of serialized input signals. For example, in some embodiments, the SRAM array 4a receives a number of serialized input signals equal to the number of bit-lines (or rows) in each of the columns 22. At operation 278, the write operation completes and the SRAM array 4a enters a ready state for one or more additional read/write operations.

Figure 9:
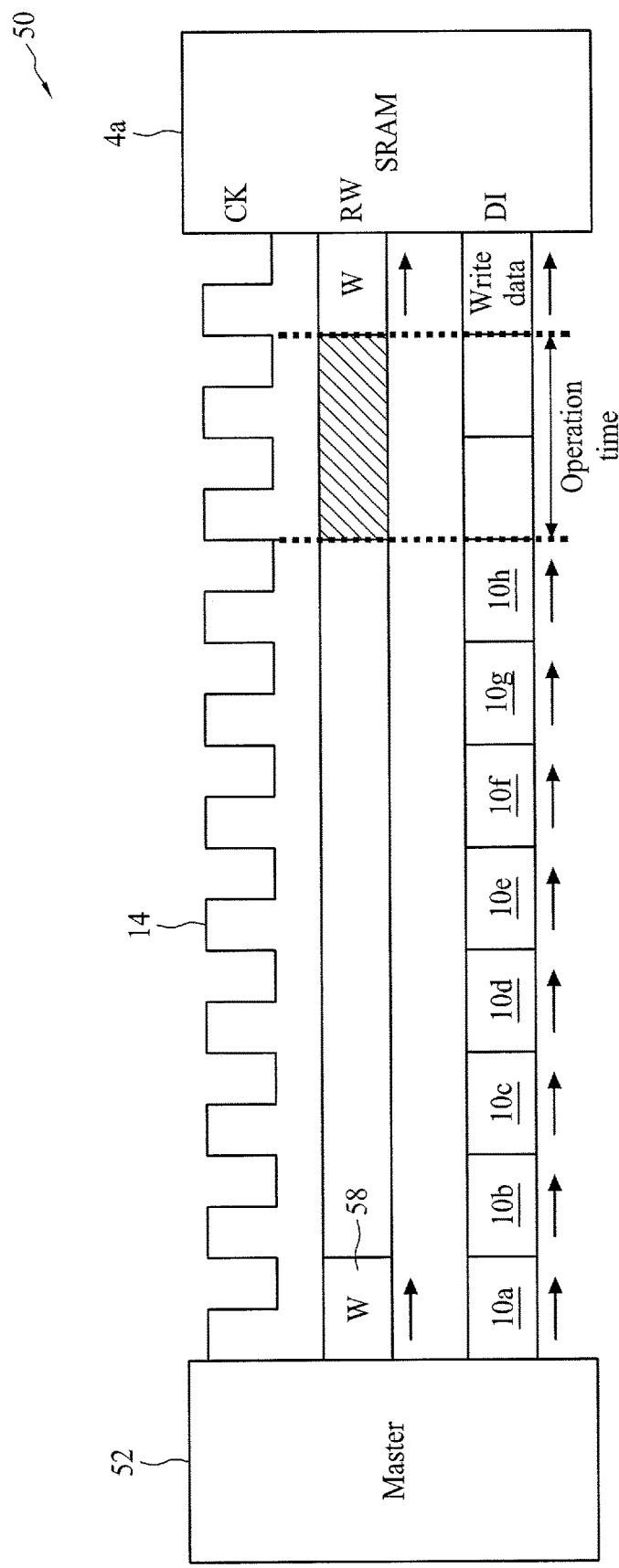
FIG. 9 illustrates an SRAM system having an SRAM master and one or more serialized/de-serialized SRAM arrays configured for a write operation, in accordance with some embodiments.

FIG. 9 illustrates the SRAM system 50 including the SRAM master 52 and the SRAM array 4a configured for a serialized write operation, in accordance with some embodiments. The SRAM master 52 is configured to provide a plurality of serialized input signals 10a-10h to the SRAM array 4a. In some embodiments, the plurality of serialized input signals 10a-10h are generated by a de-serializer (see FIG. 1) formed integrally with and/or separate from the SRAM master 52. The SRAM master 52 generates a first write signal 58a that is provided to the SRAM array 4a simultaneously with the first serialized input signal 10a. The write signal 58a includes a write-enable signal and/or an address signal indicating a write operation. The SRAM array 4a receives the write signal 58a and the first serialized input signal 10a. The SRAM array 4a subsequently receives one or more additional serialized input signals 10b-10h. Each of the serialized input signals 10a-10h include a bit-width equal to the number of columns in the SRAM array 4a. In some embodiments, each of the serialized input signals 10a-10h are latched by one or more circuit elements in the SRAM array 4a.

The SRAM array 4a writes each of the received serialized input signals 10a-10h to the respective bit-lines of each of the columns 22 in the SRAM array 4a. In some embodiments, the SRAM array 4a performs a first write operation to write a first set of bits having a first bit value and a second write operation to write a second set of bits having a second bit value. After performing the write operation, a second write signal 58b and second plurality of serialized input signals 10 can be received at the SRAM array 4a.

Figure 10:
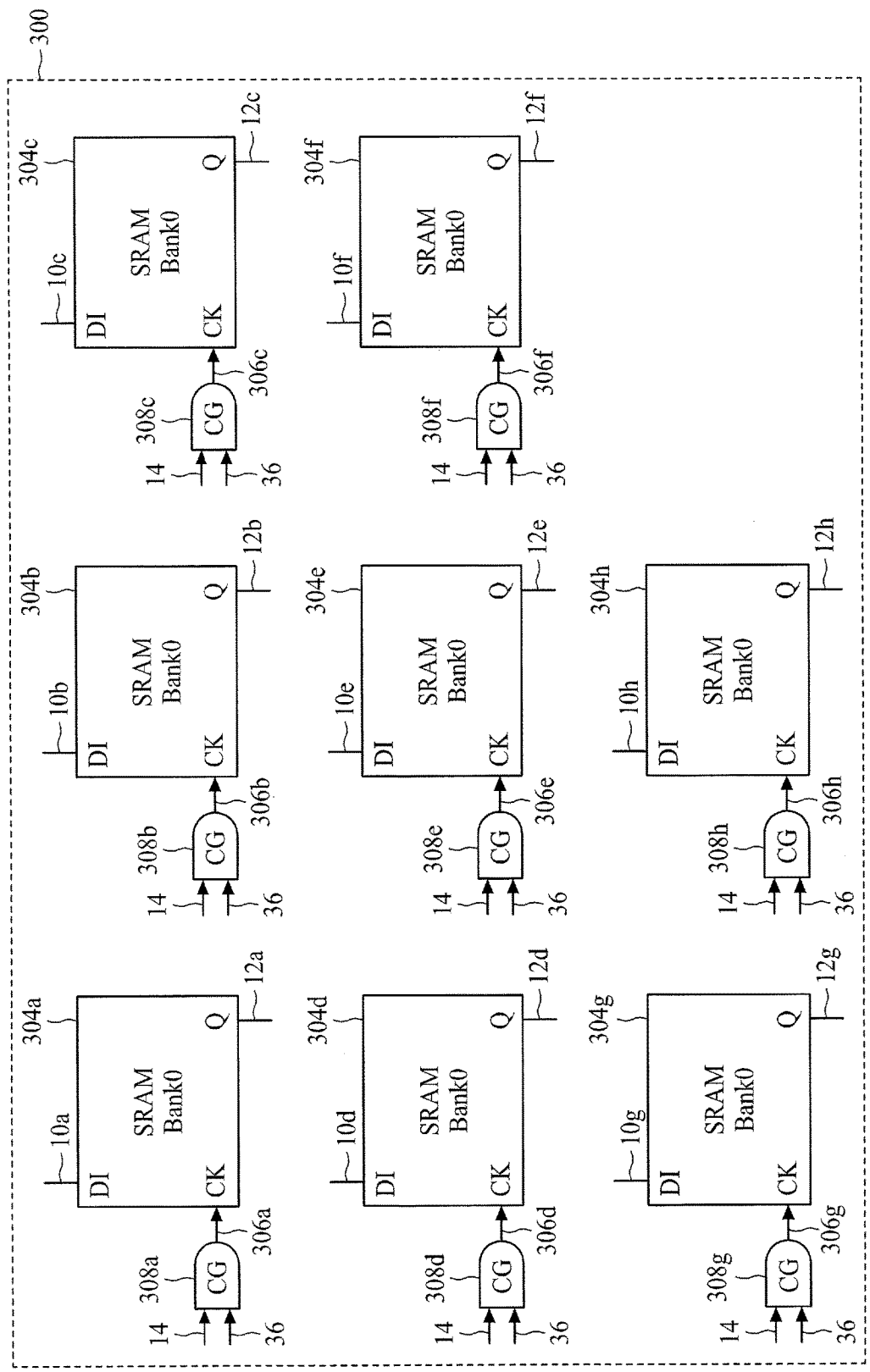
FIG. 10 illustrates a serialized/de-serialized SRAM system including a plurality of SRAM banks configured to generate and/or receive a serialized signal, in accordance with some embodiments.

FIG. 10 illustrates a system 300 including a plurality of SRAM banks 304a-304h (collectively "the SRAM banks 304") configured to generate and/or receive a serialized signal, in accordance with some embodiments. Each of the SRAM banks 304 is similar to the SRAM array 4 discussed above, and similar description is not repeated herein. Each of the SRAM banks 304 is configured to receive an input signal 10a-10h from one or more sources, such as, for example, an SRAM master. Each of the SRAM banks 304 is further configured to receive a bank-specific clock signal 306a-306h (collectively "the bank-specific clock signals 306").

In some embodiments, each of the bank-specific clock signals 306 is generated by a respective clock-generator 308a-308h (collectively "the clock-generators 308"). The clock generators 308 are each configured to receive the first clock signal 14 and an address signal 310. In some embodiments, the address signal 36 is combined with an internal count signal (not shown) to generate a block-specific identifier. When the block specific identifier matches a predetermined identifier of the clock generator 308, the clock generator 308 passes the first clock signal 14 to the respective SRAM bank 304.

In some embodiments, the system 300 is configured to serialize a non-serialized input signal 18. For example, in some embodiments, each of the SRAM banks 304 is configured to receive one of a plurality of serialized input signals 10a-10h. The SRAM banks 304 store each of the respective serialized input signals 10a-10h in a serialized process. For example, during a first clock cycle of the first clock signal 14, a first SRAM bank 304a latches the first serialized input signal 10a. During a second cycle of the first clock signal 14, the second SRAM bank 304b latches the second serialized input signal 10b. Each of the subsequent SRAM banks 304c-304h latch a respective serialized input signal 10c-10h during consecutive subsequent clock cycles of the first clock signal 14. In some embodiments, each of the serialized input signals 10a-10h are generated by a serializer 6, as discussed above with respect to FIG. 1.

In some embodiments, the system 300 is configured to generate a plurality of serialized outputs 12a-12h. For example, in some embodiments, each of the SRAM banks 304 is configured to generate one of a plurality of serialized outputs 12a-12h during a serialized read operation. For example, during a first clock cycle of the first clock signal 14, a first SRAM bank 304a generates a first serialized output signal 12a. During a second clock cycle, the second SRAM bank 304b generates a second serialized output signal 12b. Each of the subsequent SRAM banks 304c-304h generates a respective serialized output signal 12c-12h during consecutive subsequent clock cycles of the first clock signal 14. In some embodiments, each of the serialized output signals 12a-12h are provided to a de-serializer 8 configured to generate a non-serialized output signal 20, as discussed in more detail above with respect to FIG. 1.

Figure 11:
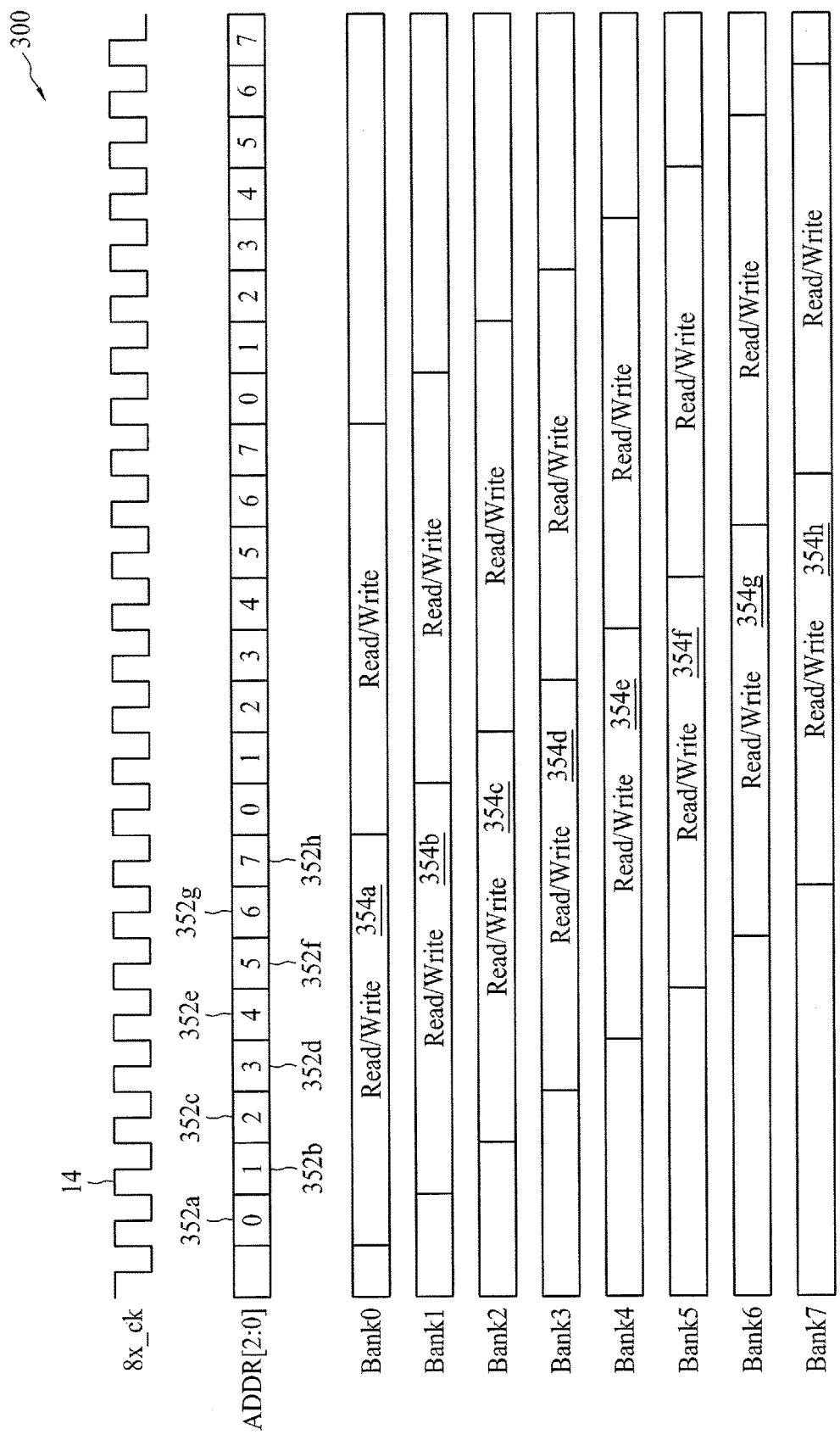
FIG. 11 illustrates a timing diagram of the serialized/de-serialized SRAM system of FIG. 10, in accordance with some embodiments.

FIG. 11 illustrates a timing diagram 350 of the system 300, in accordance with some embodiments. The timing diagram 350 illustrates a first clock signal 14 and behavior of each of the SRAM banks 304. At time to, an address signal 310 is received at the system 300 having a first value indicating a first-bank identifier 352a. The first bank identifier 352a causes the first SRAM bank 304a to initiate a first serialized read/write operation 354a. At time $t_1$, the address signal 510 (and/or one or more additional signals) indicate a second-bank identifier 352b. The second bank-identifier 352b causes the second SRAM bank 304b to initiate a second serialized read/write operation 354b. The address signal 310 is transitioned through one or more additional bank identifiers 352c-352h, each corresponding to one of the SRAM banks 304c-304h in the system 300. Each of the additional bank identifiers 352c-352h initiate a subsequent serialized read/write operation 354c-354h.

In one embodiment, a circuit is provided that includes: a first circuit configured to receive a non-serialized input signal having a first bit-width and generate a plurality of serialized input signals each having a second bit-width; and a static random access memory (SRAM) array, wherein the SRAM array is configured to receive each of the plurality of serialized input signals, and wherein the SRAM array is configured to generate a plurality of serialized output signals; and a second circuit configured to receive the plurality of serialized output signals and generate a non-serialized output signal, wherein the plurality of serialized output signals each having the second bit-width, and wherein the non-serialized output signal has the first bit-width.

In a further embodiment, an SRAM system includes: a plurality of SRAM arrays each comprising a plurality of columns having a plurality of bit-cells therein, wherein each of the plurality of SRAM arrays is configured to receive an input signal and generate an output signal; and a plurality of clock generators, wherein each of the plurality of clock generators is configured to generate an array-specific clock signal for a respective one of the plurality of SRAM arrays.

In yet another embodiment, an SRAM circuit includes: a plurality of columns each including: a plurality of bit-cells each electrically coupled to one of a plurality of bit-lines; a multiplexer electrically coupled to each of the plurality of bit-lines, wherein the multiplexer is configured to select one of the plurality of bit-lines; and a sensing amplifier electrically coupled to the multiplexer, wherein the sensing amplifier is configured to generate a bit-output based on the selected one of the plurality of bit-lines. The SRAM circuit further includes: a row decoder configured to generate one or more control signals for each of the plurality of columns in response to an address signal; and a flip flop configured to receive one or more address signals and generate one or more bit-selection signals for the row decoder and the multiplexer in each of the plurality of columns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first circuit configured to receive a non-serialized input signal having a first bit-width and generate a plurality of serialized input signals each having a second bit-width; and
a static random access memory (SRAM) array, wherein the SRAM array is configured to receive each of the plurality of serialized input signals, and wherein the SRAM array is configured to generate a plurality of serialized output signals; and
a second circuit configured to receive the plurality of serialized output signals and generate a non-serialized output signal, wherein the plurality of serialized output signals each having the second bit-width, and wherein the non-serialized output signal has the first bit-width.

2. The circuit of claim 1, wherein the SRAM array is configured to receive a signal indicative of a write operation, and wherein the SRAM array performs a plurality of sequential write operations to write each bit of each of the plurality of serialized input signals to a respective bit-cell in the SRAM array in response to the signal indicative of a write operation.

3. The circuit of claim 1, wherein the SRAM array is configured to receive a signal indicative of a read operation, and wherein the SRAM array performs a plurality of sequential read operations to generate each bit of the plurality of serialized output signals from a respective bit-cell in the SRAM array in response to the signal indicative of a read operation.

4. The circuit of claim 1, wherein the first bit-width is a whole number multiple of the second bit-width.

5. The circuit of claim 4, wherein the whole number multiple is equal to a number of columns in the SRAM array.

6. The circuit of claim 1, comprising:
a first clock signal having a first cycle time, wherein the first clock signal is provided to the first circuit and the second circuit; and
a second clock signal having a second cycle time, wherein the second clock signal is provided to the first circuit, the second circuit, and the SRAM array, and wherein the second cycle time is less than the first cycle time.

7. The circuit of claim 1, comprising:
a d-type flip flop configured to receive an address signal; and
a row decoder configured to receive a portion of the address signal, and wherein the row decoder is configured to generate to select a predetermined row within each of a plurality of columns of the SRAM array.

8. The circuit of claim 7, wherein each of the plurality of columns comprises:
a multiplexer coupled to a bit-line associated with each of the plurality of bit-cells, wherein the multiplexer is configured to output a selected one of the bit-lines; and
a sensing amplifier coupled to the multiplexer, wherein the sensing amplifier is configured to detect an output of the multiplexer and generate a bit-output, wherein the bit-output comprises one bit of one of the plurality of serialized output signals.

9. The circuit of claim 1, comprising:
a plurality of d-type flip flops each configured to receive one bit of each of the plurality of serialized input signals; and
a write decoder configured to receive an input from each of the plurality of d-type flip flops, wherein the write decoder is configured to generate a plurality of bit-line write signals in response to the input from each of the plurality of d-type flip flops.

10. The circuit of claim 9, wherein the write decoder is configured to latch each input from each of the plurality of d-type flip flops for each of the plurality of serialized input signals.

11. The circuit of claim 10, wherein the write decoder is configured to generate a first set of bit-line write signals and a second set of bit-line write signals, wherein the first set of bit-line write signals comprise a write bit-signal for each latched input having a first value, and wherein the second set of bit-line write signals comprise a write bit-signal for each latched input having a second value.

* * * * *